United States Patent [19]

Roger

[11] 4,258,380

[45] Mar. 24, 1981

[54] BIPOLAR TRANSISTOR HAVING AN INTEGRATED RESISTIVE EMITTER ZONE

[75] Inventor: Bernard P. Roger, Carpiquet, France

[73] Assignee: U.S. Philips Corporation, New York, N.Y.

[21] Appl. No.: 12,188

[22] Filed: Feb. 14, 1979

[30] Foreign Application Priority Data

Feb. 21, 1978 [FR] France ................... 78 04856

[51] Int. Cl.³ .............................................. H01L 27/02
[52] U.S. Cl. ......................................... 357/51; 357/34; 357/36; 357/88
[58] Field of Search ................... 357/34, 36, 51, 88

[56] References Cited

U.S. PATENT DOCUMENTS 3,427,511  2/1969  Rosenzweig ........................... 357/36

FOREIGN PATENT DOCUMENTS 1514875 11/1969 Fed. Rep. of Germany ............. 357/36
1614877 12/1970 Fed. Rep. of Germany ............. 357/36

Primary Examiner—Edward J. Wojciechowicz
Attorney, Agent, or Firm—Thomas A. Briody; Robert T. Mayer; Steven R. Biren

[57] ABSTRACT

A bipolar transistor includes an integrated resistive emitter zone of closed geometric configuration which divides the emitter region of the transistor into two sub-regions. The integrated resistive emitter zone serves to improve the secondary breakdown characteristics of the transistor, so that transistors in accordance with the invention are particularly suited for use in power transistors.

7 Claims, 2 Drawing Figures

BIPOLAR TRANSISTOR HAVING AN INTEGRATED RESISTIVE EMITTER ZONE

BACKGROUND OF THE INVENTION

The present invention relates to a bipolar transistor having a semiconductor body and an emitter region which in the body is surrounded by a base region, said two regions adjoining a major surface of the said body, two conductive contacts being provided at said major surface, namely a first contact bearing on the said emitter region and a second contact bearing on the said base region, the said transistor comprising in its emitter region an integrated resistive zone having a closed geometric configuration, the said configuration being parallel to the said major surface.

The invention relates in particular to a bipolar power transistor suitable for operation at high frequencies and having a resistor in its emitter region.

It is known that the operation of power transistors is impeded by a phenomenon known as "secondary breakdown". Briefly, this phenomenon is connected with a concentration of electric exchanges at the level of the emitter-base junction of a transistor in sharply localized and comparatively small areas of said junction; such a concentration creates local heating which produces breakdown which may lead to the destruction of the said junction.

Various solutions have been recommended in the past to avoid thermal load leading to breakdown of the junction. The most attractive among these solutions consists of interposing a resistive zone in the emitter-base current path of the transistor, either in the emitter region, or in the base region of said transistor; it is also possible to provide a resistive zone in each of the said regions.

An interesting embodiment using a resistive zone included in the emitter region of a transistor is suggested in German Patent Application No. 2,332,144.

The transistor described in said Patent Application comprises an emitter region, approximately 10 $\mu$m deep, diffused in an epitaxial layer having a thickness of 25 $\mu$m forming the base region, said epitaxial layer bearing on a solid substrate constituting the collector region of the said transistor. The emitter-base junction extends to the surface of the said epitaxial layer and bounds an emitter area on the central portion on which a conductive contact is provided. All around said contact a groove extends which has been cut in the emitter region down to a depth in the order of 6 to 7 $\mu$m. A conductive base contact bears on the surface of the said epitaxial layer outside the emitter region. The greater part of the electric current which passes between the emitter and base contacts of the transistor hence must necessarily flow below said groove in a deep zone of the emitter region of which the height is reduced—3 to 4 $\mu$m—with respect to that—10 $\mu$m—of the remainder of the emitter region. The deep zone is comparatively lightly doped with respect to the surface portion, traverses the groove and is hence sufficiently resistive. Said deep zone thus constitutes a resistive zone which is integrated in the emitter region and is situated, as is desired, in the emitter-base current path of the transistor.

A transistor having a resistive emitter zone thus manufactured is satisfactory with respect to resistance to the secondary breakdown phenomenon. Unfortunately, the manufacture of a transistor of this type is impeded by the necessity of making a groove in the emitter region so as to form the resistive zone. In fact it involved a delicate operation, on the one hand because it is effected in a very sensitive region of the transistor which has a small volume, and on the other hand and in particular because of the necessary dimensional precision: the width and the depth of the groove made depend the width and the depth of the resistive zone and hence the resistance value of said resistive zone.

SUMMARY OF THE INVENTION

It is the object of the present invention to provide a transistor comprising a resistive zone integrated in its emitter region, in a form which is improved with respect to previously realized comparable transistors, and in which notably the resistance value of the said resistive zone is adjusted with better precision.

Another object of the invention is to facilitate the manufacture of such a transistor, in particular by avoiding steps which only serve to form the said resistive zone.

The invention takes into consideration the fact that, in a semiconductor material doped by diffusion with an impurity, the concentration level of the said impurity decreases regularly from the diffusion surface with a corresponding increase of the resistivity of the said material.

According to the invention, a transistor having a semiconductor body and an emitter region which in the body is surrounded by base region, said two regions adjoining a major surface of the said body, two conductive contacts being provided at said major surface, namely a first contact bearing on the said emitter region and a second contact bearing on the said base region, the said transistor comprising in its emitter region an integrated resistive zone having a closed geometric configuration, the said configuration being parallel to the said major surface, is characterized in that the said resistive zone extends, in the depth, that is to say in a direction substantially perpendicular to the said major surface, from said major surface down to the base region and thus divides the said emitter region into first and second sub-regions, the first sub-region being situated inside the said closed geometric configuration and being covered at least partly by the said first conductive contact and the second sub-region being situated outside the said configuration and nearer to said second conductive contact.

Preferably, transistors according to the invention are characterized moreover in that the said emitter sub-regions and the said resistive zone are of the same semiconductor material of the same conductivity type, the specific difference between the resistive zone and the emitter region being that the resistive zone is more lightly doped than the emitter region. In particular, the concentrations of doping impurity (ies) which provide(s) the said conductivity type, considered in planes parallel to the said major surface, are, for a given plane, lower in the resistive zone than they are in the emitter sub-regions.

In a transistor according to the invention it is hence not necessary to make a groove to form a resistive zone in the emitter. This is an advantage with respect to the type of transistor described above. On the other hand, in this latter case, the groove occupies a comparatively large area in the emitter region, which is larger than that occupied by the resistive zone of a transistor according to the invention.

According to a preferred embodiment of obtaining a transistor emitter structure as provided by the invention, the emitter region is formed by diffusion in the base region through two apertures made in an insulating mask covering the major surface of the semiconductor body. One of these apertures, the central aperture, is completely surrounded by the other, or peripheral, aperture. The distance separating their adjaent borders (edges) is small and provided such that, by lateral diffusion below the mask, the regions diffused through each of the apertures can meet and partly coincide by overlapping. The overlapping zones then constitutes a zone of comparatively small impurity concentrations with respect to those of the regions situated straight below the apertures, compared at the same depth in the structure and which have benefitted by a diffusion in a direction perpendicular to the major surface. The overlapping zone forms a resistive zone integrated in the emitter region formed by the whole volume diffused in the two apertures and divides the said emitter region into first and second sub-regions, the first sub-region being situated within the closed geometric configuration which it determines the second being situated outside said geometric configuration.

In this embodiment, the resistive zone has a variable width (dimension in a direction parallel to the active face) according to the depth in the structure which, typically, diminishes from the major surface down to the underlying base region.

It will be clear that, by influencing the distance between adjacent edges of the two apertures, it is possible, for given diffusion conditions, to influence both the thickness and the impurity concentration of the resistive zone. Hence the resistance value of said resistive zone can be influenced in a much simpler manner and over a larger range of values than by making a groove. Moreover, the absence of a groove results in area savings in the structure. So the invention complies with the miniaturization which is desired for semiconductor devices.

It is to be noted that it is known to manufacture resistors by lateral overlapping of adjacent semiconductor regions obtained by a simultaneous diffusion. French Patent Application No. 2,064,191 notably shows that it is possible in this manner to form chains of resistors in series which may be used as passive integrated circuit elements. However, these chains have a structure which differs considerably from the closed geometry resistance formed in the emitter of a transistor according to the invention.

BRIEF DESCRIPTION OF THE DRAWING

The invention will be described in greater detail with reference to an embodiment and the accompanying drawing, in which.

It is to be noted that in the figures the geometrical proportions between the various elements constituting the transistor have not been taken into account; this has been done for the purpose of making the figures clearer.

DETAILED DESCRIPTION

Figure 1:
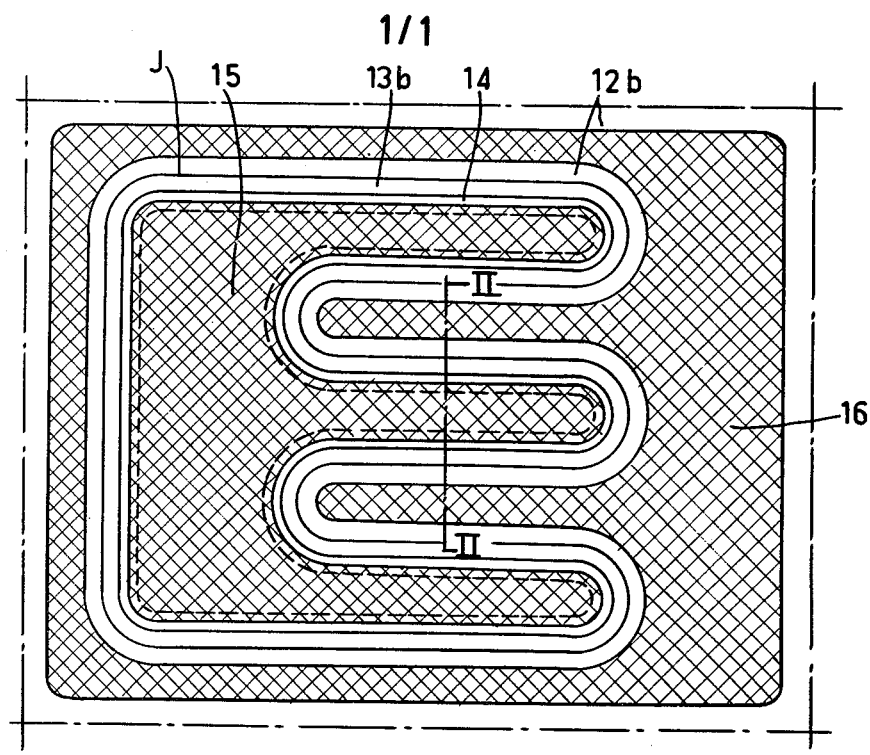
FIG. 1 is a diagrammatic plan view of the major surface showing the emitter region and the adjoining part of the base region of a transistor according to the invention.
Figure 2:
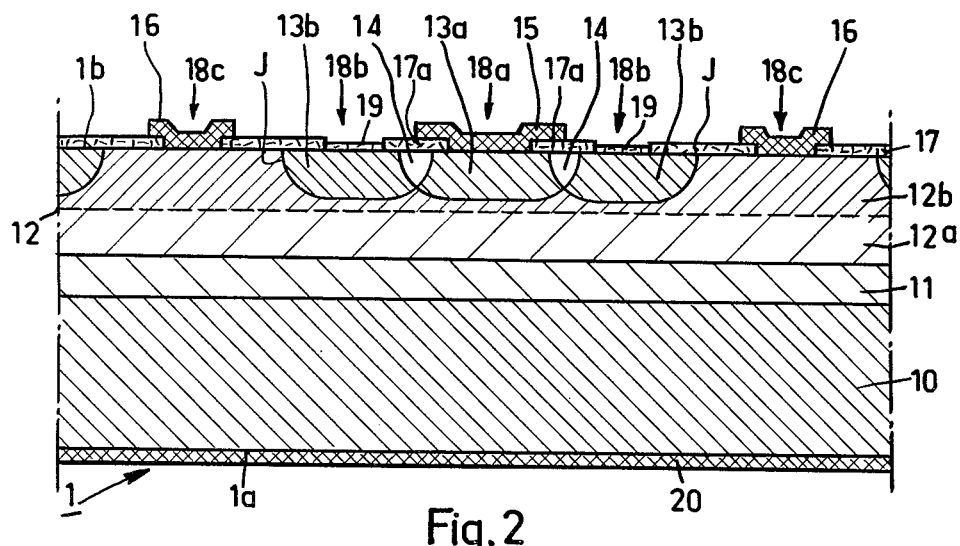
FIG. 2 is a sectional view of the said transistor taken on the line II—II of FIG. 1 on a larger scale than that on FIG. 1.

The transistor shown partly in FIGS. 1 and 2 is a power transistor, for example of the npn-type. It is manufactured in a silicon body 1 in the direction of thickness of which are distinguished successively from the lower face 1a towards the major surface or active face 1b, first a highly doped n-type substrate 10, then a first epitaxial layer 11 also of the n-type but low-doped, then a second epitaxial layer 12 of the p-type, which has a lowly-doped lower portion 12a and a surface layer 12b which is comparatively highly doped.

The substrate 10 and the first epitaxial layer 11 constitute the collector region of the transistor; the epitaxial layer 12 forms the base region.

The emitter region 13 of the said transistor of the n-type is surrounded in the body by the base region 12. These two regions adjoin the major surface 1b of the body and the junction J situated at their interface extends to the major surface.

It is known that in a power transistor the periphery of the emitter-base junction, for a given emitter surface area, is made as long as possible, each of the two emitter and base regions presenting to this effect peripheral elongations, or fingers, which are closely interdigitated. This for the purpose of maintaining the density of the emitter-base current per unit of surface area of the junction in appropriate limits. In FIG. 1, only three emitter fingers are shown between which are inserted two base fingers, which is sufficient for the comprehension of the invention but which does not present any restriction thereto.

In the emitter region 13 of the transistor a resistive zone 14 is integrated which appears in the form of two portions without cross-hatching in FIG. 2 and which continues into the said region 13 at a distance from the junction J thus forming a figure of closed geometry.

According to the invention, the said resistive zone 14 extends, in the depth, that is to say in a direction substantially perpendicular to the major surface face 1b, from said surface 1b down to the base region 12a–12b situated below the emitter region 13 and thus divides the said emitter region 13 into first and second sub-regions 13a and 13b respectively. The first sub-region 13a situated inside the closed geometric configuration formed by the resistive zone 14 is covered by a conductive contact 15. The second sub-region 13b is situated outside the said figure and is nearer to a second conductive contact 16 bearing on the base region 12a–12b.

Advantageously, the resistive zone 14, as shown in the figures, continues at a regular distance from the edge of the junction J at the major surface 1b; however, such a disposition is not imperative.

The transistor according to the invention is preferably characterized in addition in that its emitter region 13 and the resistive zone 14 are of the same semiconductor material of the same conductivity type—in the present case of the n-type in the case of an npn transistor—the zone 14, however, being less doped than the region 13. At the same level of depth in the structure, the concentration of doping impurity(ies) of the n-type is lower in the zone 14 than it is in the sub-regions 13a and 13b of the emitter region.

The method of manufacturing a power transistor as shown partly in FIGS. 1 and 2 is carried out by means of techniques known in semiconductor technology. Starting from an N+ type silicon body doped with antimony to present a resistivity in the order of 15 mOhm.cm, a first n-type epitaxial layer 11 is deposited which is doped with arsenic to have a resistivity of ≃3 Ohm.cm, in a thickness of 12 μm. A second p-type epitaxial layer 12 is then deposited which is doped with boron. The first or deeper part 12a has a resistivity of ≃7 Ohm.cm and a thickness of 15 μm. The second or surface part 12b has a sheet resistance of ≃100 Ohm per square and a thickness of 6 μm. A mask 17 (see FIG. 2) is formed by photo-etching, the windows 18a and 18b of which mask correspond to the sub-regions 13a and 13b respectively of the emitter region 13 to be formed. The window 18a is separated from the window 18b by an island 17a of the mask 17 (actually, the island 17a of FIG. 2 is a long narrow band which forms a closed figure) of which the width somewhat smaller than double the depth provided for the emitter region 13. A phosphorus diffusion through the windows 18a and 18b is carried out so as to obtain a diffusion depth of 5 μm (the width of the oxide band 17a is thus chosen, for example, equal to 8 μm) with a surface concentration of $10^{20}$ atoms/cm$^3$. The volumes diffused through the windows 18a and 18b meet and overlap each other laterally, thus forming, simultaneously with the emitter region 13, the resistive zone 14.

In said zone 14 the doping level is in fact lower than in adjoining sub-regions 13a and 13b of the emitter and the resistivity is thus higher. The resistance of said zone 14 depends on several factors, including the width of the band-shaped island 17a which determines, for a given depth of the emitter region, the depth and the thickness of the said zone and its average impurity level. It is to be noted that the resistive zone 14 extends, in the thickness, a little beyond the limits represented by the two portions left clear in FIG. 2. In fact, at equal depth levels in the emitter region, the diffused impurity concentrations are smaller below the band-shaped island 17a (where the diffusion is lateral) than they are directly below the window 18. The thickness of the resistive zone 14 generally diminishes with the depth.

During the phosphorus diffusion a thin silicon oxide layer 19 is formed at the major surface in the windows 18a and 18b which is left in place in the window 18b but which is removed from the window 18a at the same time as the aperture 18c above to the base region 12 is formed. The device is completed by the deposition of an aluminum layer by evaporation in a vacuum and etching said layer to form the conductor contacts 15 on the emitter sub-region 13a and 16 on the base region. A conductive contact 20 is also deposited on the face 1a of the body 1 which contact forms the collector contact of the transistor.

The transistor described by way of example is of the npn type. However, the invention extends without particular modification to a pnp transistor. Moreover, although the invention relates in particular to a power transistor, it will be obvious that, if desired, it may also be extended to other semiconductor devices.

What is claimed is:
1. A bipolar transistor, which comprises:
   a semiconductor body having a major surface;
   a surface-adjoining base region of a first conductivity type having a conductive base contact at its surface;
   a surface-adjoining emitter region of a second conductivity type opposite to that of the first and located in said base region, said emitter region being surrounded by said base region and forming a p-n junction therewith, and said emitter region having a conductive emitter contact at its surface; and
   an integrated resistive emitter zone of closed geometric configuration within said emitter region and extending from the surface of said emitter region to said junction to divide said emitter region into first and second sub-regions, said first sub-region being located within said closed geometric configuration and connected to said conductive emitter contact and said second sub-region being located outside said closed geometric region and between said first sub-region and said conductive base contact.

2. A transistor as claimed in claim 1, characterized in that said emitter sub-regions and said resistive zone are both of the same semiconductor material and the same conductivity type, and that said resistive emitter zone is more lightly doped than said sub-regions.

3. A transistor as claimed in claim 2, characterized in that the doping impurity concentration in said resistive emitter zone in a selected plane parallel to said surface is lower than the doping impurity concentration in said emitter sub-regions in said selected plane.

4. A transistor as claimed in claim 1, characterized in that the width of said resistive emitter zone varies as a function of the distance from said major surface.

5. A transistor as claimed in claim 4, characterized in that the width of said resistive emitter zone decreases as a function of the distance from said major surface.

6. A transistor as claimed in claim 1, characterized in that all portions of the resistive emitter zone are spaced at a substantially constant distance from the intersection of said p-n junction with said major surface.

7. A transistor as claimed in claim 1, wherein the two sub-regions of the emitter region are formed by two laterally overlapping diffused volumes of the same doping impurity, the common overlapping portion of said volumes comprising at least partly said resistive emitter zone.

* * * * *